United States Patent
Hiramoto et al.

(10) Patent No.: US 8,902,339 B2
(45) Date of Patent: Dec. 2, 2014

(54) SOLID-STATE IMAGING ELEMENT AND DISPERSING ELEMENT ARRAY FOR IMPROVED COLOR IMAGING

(75) Inventors: Masao Hiramoto, Osaka (JP); Toshiya Fujii, Shiga (JP); Tatsuya Nakamura, Osaka (JP); Masaaki Suzuki, Osaka (JP); Yusuke Monobe, Kyoto (JP); Yoshiaki Sugitani, Nara (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 106 days.

(21) Appl. No.: 13/814,999

(22) PCT Filed: May 25, 2012

(86) PCT No.: PCT/JP2012/003429
§ 371 (c)(1),
(2), (4) Date: Feb. 8, 2013

(87) PCT Pub. No.: WO2012/172735
PCT Pub. Date: Dec. 20, 2012

(65) Prior Publication Data
US 2013/0135493 A1    May 30, 2013

(30) Foreign Application Priority Data

Jun. 16, 2011 (JP) .................................. 2011-134391

(51) Int. Cl.
H04N 5/335 (2011.01)
(Continued)

(52) U.S. Cl.
CPC .... H01L 27/14625 (2013.01); H01L 27/14621 (2013.01); H01L 27/14629 (2013.01); H04N 9/045 (2013.01)
USPC ........................................ 348/273; 348/222.1

(58) Field of Classification Search
USPC .............................................. 348/222.1, 273
See application file for complete search history.

(56) References Cited

U.S. PATENT DOCUMENTS

| 4,670,777 A | 6/1987 | Ishikawa et al. |
| 2002/0005471 A1 | 1/2002 | Suzuki |
| 2003/0063204 A1 | 4/2003 | Suda |
| 2004/0004668 A1 | 1/2004 | Namazue et al. |
| 2010/0176473 A1 | 7/2010 | Nishiwaki |

(Continued)

FOREIGN PATENT DOCUMENTS

| JP | 59-090467 A | 5/1984 |
| JP | 59-137909 A | 8/1984 |

(Continued)

OTHER PUBLICATIONS

International Search Report for corresponding International Application No. PCT/JP2012/003429 mailed Aug. 14, 2012.

*Primary Examiner* — Usman Khan
(74) *Attorney, Agent, or Firm* — Renner, Otto, Boisselle & Sklar, LLP

(57) ABSTRACT

A solid-state image sensor includes a photosensitive cell array and a dispersing element array. Each unit block 40 of the photosensitive cell array includes four photosensitive cells 2a, 2b, 2c and 2d. The dispersing element array makes light, obtained by subtracting a light ray with a first color component (C1) from incoming light (W) and adding a light ray with a second color component (C2) thereto, incident on the first photosensitive cell 2a, also makes light, obtained by subtracting the light ray with the second color component (C2) from the incoming light (W) and adding the light ray with the first color component (C1) thereto, incident on the second photosensitive cell 2b, further makes light, obtained by subtracting a light ray with a third color component (C3) from the incoming light (W) and adding the light rays with the first and second color components (C4=C1+C2) thereto, incident on the third photosensitive cell 2c, and further makes light, obtained by subtracting the light rays with the first and second color components (C4) from the incoming light (W) and adding the light ray with the third color Component (c3) thereto, incident on the fourth photosensitive cell 2d.

13 Claims, 10 Drawing Sheets

(51) Int. Cl.
*H01L 27/146* (2006.01)
*H04N 9/04* (2006.01)

(56) References Cited

U.S. PATENT DOCUMENTS

| | | |
|---|---|---|
| 2010/0188537 A1 | 7/2010 | Hiramoto et al. |
| 2011/0050941 A1 | 3/2011 | Hiramoto et al. |

FOREIGN PATENT DOCUMENTS

| | | |
|---|---|---|
| JP | 2000-151933 A | 5/2000 |
| JP | 2001-309395 A | 11/2001 |
| JP | 2003-078917 A | 3/2003 |
| JP | 2003-259232 A | 9/2003 |
| JP | 2005-167356 A | 6/2005 |
| JP | 2008-060323 A | 3/2008 |
| JP | 4264465 B | 2/2009 |
| WO | 2009/153937 A1 | 12/2009 |
| WO | 2010/058545 A1 | 5/2010 |

FIG. 2
(a)
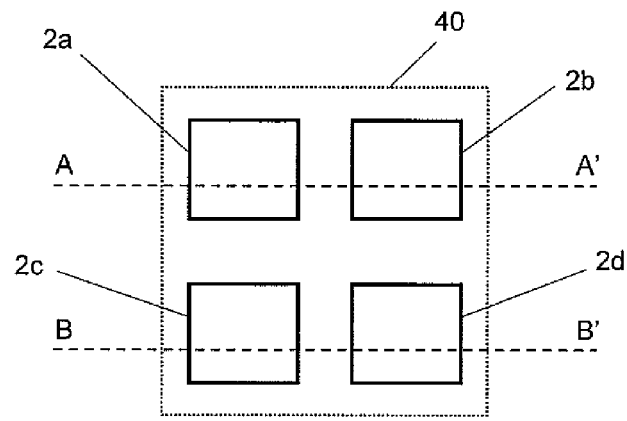
(b)
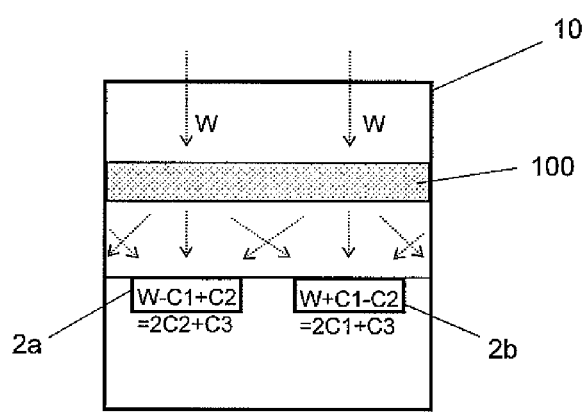
(c)
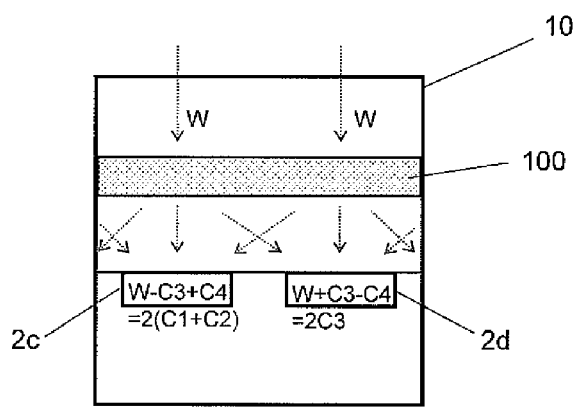

FIG. 5
(a)
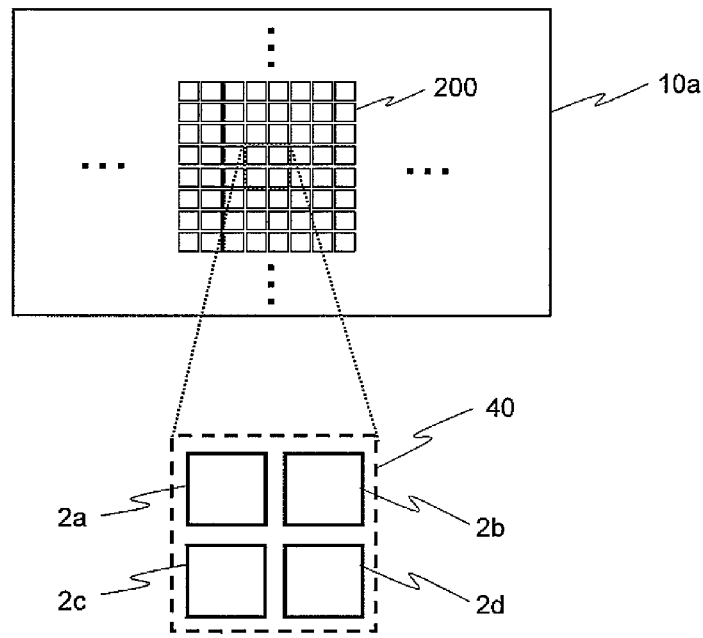
(b)
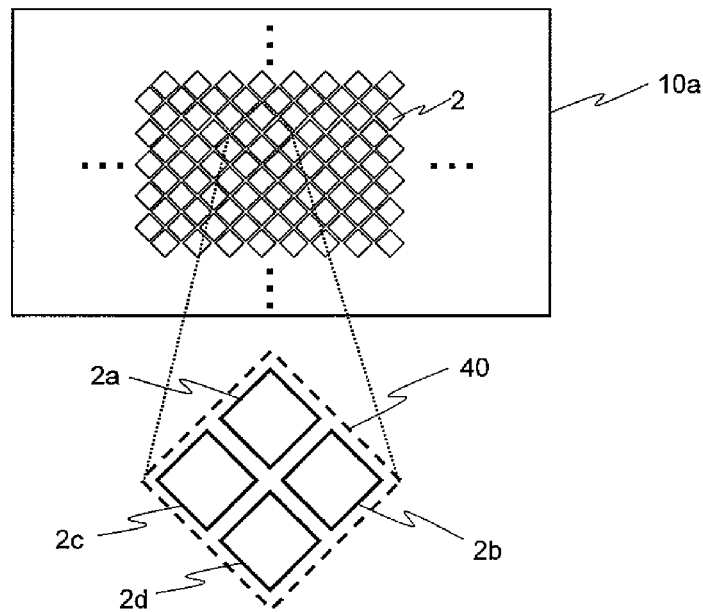

FIG. 9
(a)
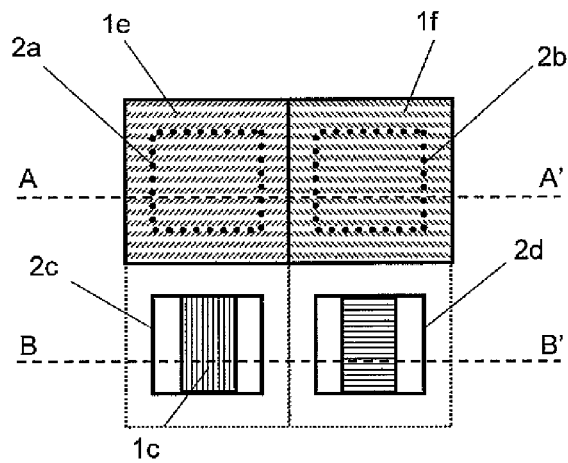
(b)
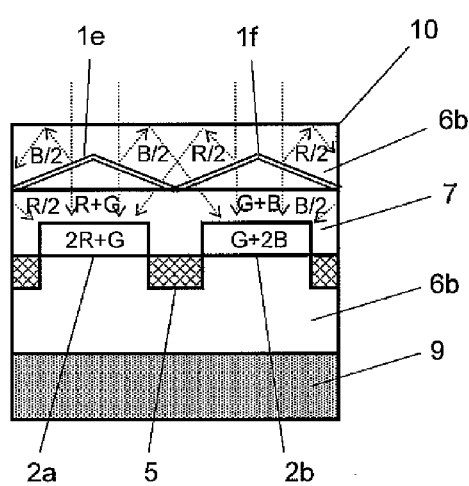
(c)
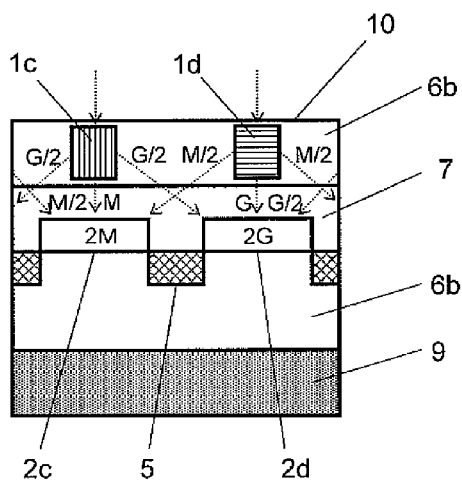

FIG. 10
(a)
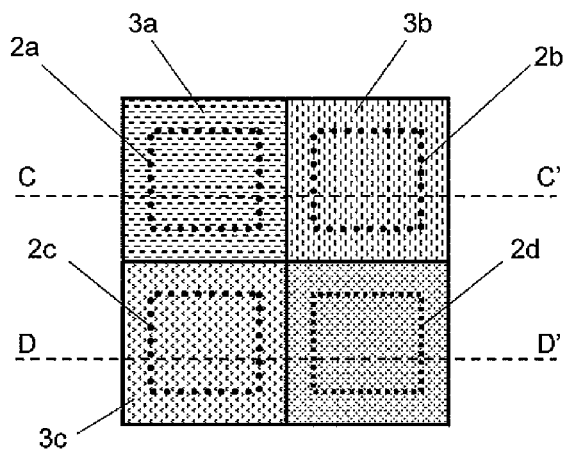
(b)
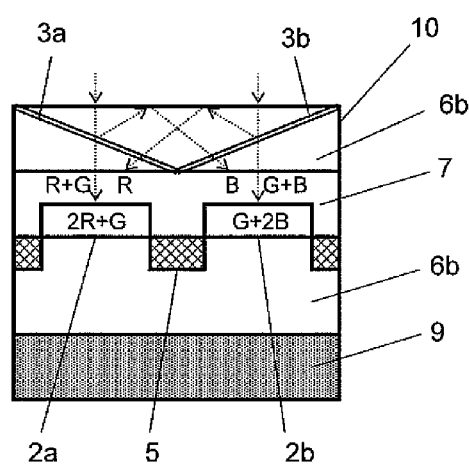
(c)
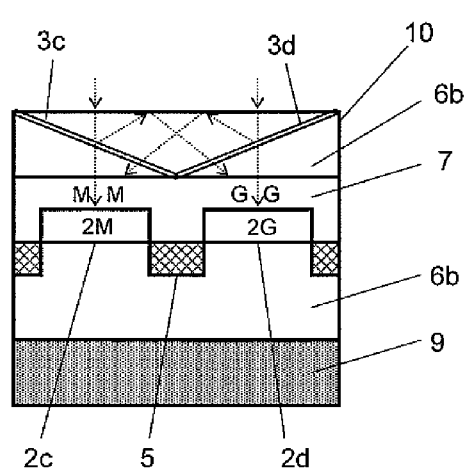

SOLID-STATE IMAGING ELEMENT AND DISPERSING ELEMENT ARRAY FOR IMPROVED COLOR IMAGING

TECHNICAL FIELD

The present invention relates to a technique for increasing the sensitivity of a solid-state image sensor and realizing color representation using such a solid-state image sensor.

BACKGROUND ART

Recently, the performance and functionality of digital cameras and digital movie cameras that use some solid-state image sensor such as a CCD and a CMOS (which will be simply referred to herein as an "image sensor") have been enhanced to an astonishing degree. In particular, the size of a pixel structure for use in an image sensor has been further reduced these days thanks to rapid development of semiconductor device processing technologies, thus getting an even greater number of pixels and drivers integrated together in an image sensor. And the performance of image sensors has been further enhanced as well. Meanwhile, cameras that use a backside illumination type image sensor, which receives incoming light on its back surface side, not on its principal surface side with a wiring layer for the solid-state image sensor, have been developed just recently and their property has attracted a lot of attention these days. Nevertheless, the greater the number of pixels in an image sensor, the lower the intensity of the light falling on a single pixel and the lower the sensitivity of camera tends to be.

The sensitivity of cameras has dropped recently due to not only such a significant increase in resolution but also the use of a color-separating color filter itself. In an ordinary color camera, a subtractive color filter that uses an organic pigment as a dye is arranged to face each photosensitive cell of an image sensor. A color filter transmits one color component of incoming light to use but absorbs the other components of the light. That is why with such a color filter, the optical efficiency of a camera would decrease. Specifically, in a color camera that uses a Bayer color filter arrangement in which color filters in three colors are arranged using a combination of one red (R) pixel, two green (G) pixels and one blue (B) pixel as a fundamental unit, the R color filter transmits an R ray but absorbs G and B rays, the G color filter transmits a G ray but absorbs R and B rays, and the B color filter transmits a B ray but absorbs R and G rays. Consequently, the sum of the quantities of light that can be used by a color camera with the Bayer arrangement is approximately only one-third of the entire incoming light.

To overcome such a decreased sensitivity problem, Patent Document No. 1 discloses a technique for increasing the quantity of the light received by attaching an array of micro lenses to a photodetector section of an image sensor so that a greater percentage of the incoming light can be used. According to this technique, the incoming light is condensed onto photosensitive cells with those micro lenses, thereby substantially increasing the optical aperture ratio of the image sensor. And this technique is now used in almost all solid-state image sensors. It is true that the aperture ratio can be increased substantially by this technique but the decrease in optical efficiency by color filters still persists.

Thus, to avoid the decrease in optical efficiency and the decrease in sensitivity at the same time, Patent Document No. 2 discloses a technique for taking in as much incoming light as possible by using multilayer color filters (as dichroic mirrors) and micro lenses in combination. Such a technique uses a combination of dichroic mirrors, each of which does not absorb light but selectively transmits only a component of light falling within a particular wavelength range and reflects the rest of the light falling within the other wavelength ranges. As a result, only a required component of the incoming light falling within a particular wavelength range can be incident on each photosensing section with causing a significant loss of the incoming light.

FIG. 11 schematically illustrates a cross section of the image sensor of Patent Document No. 2 as viewed on a plane that intersects with its imaging area at right angles. This image sensor includes two condensing micro lenses 4a and 4b, which are respectively arranged on the surface and inside of the image sensor, an opaque member 20, photosensitive cells 2a, 2b, and 2c, and dichroic mirrors 17, 18 and 19, which are arranged so as to face photosensitive cells 2a, 2b and 2c, respectively. The dichroic mirror 17 has such a property as to transmit an R ray and reflect G and B rays. The dichroic mirror 18 has such a property as to reflect a G ray and transmit R and B rays. And the dichroic mirror 19 has such a property as to reflect a B ray and transmit R and G rays.

The light that has impinged on the micro lens 4a has its luminous flux adjusted by the micro lens 4b, and then enters the first dichroic mirror 17, which transmits an R ray but reflects G and B rays. The light ray that has been transmitted through the first dichroic mirror 17 is then incident on the photosensitive cell 2a. On the other hand, the G and B rays that have been reflected from the first dichroic mirror 17 enter the second dichroic mirror 18 adjacent to the first dichroic mirror 17. The second dichroic mirror 18 reflects the G ray of the incoming light and transmits its B ray. The G ray that has been reflected from the second dichroic mirror 18 is incident on the photosensitive cell 2b. On the other hand, the B ray that has been transmitted through the second dichroic mirror 18 is reflected from the third dichroic mirror 19 and then incident on the photosensitive cell 2c that is located right under the dichroic mirror 19. In this manner, in the image sensor disclosed in Patent Document No. 2, the visible radiation that has impinged on the condensing micro lens 4a is not absorbed into color filters but their RGB components can be detected by the three photosensitive cells non-wastefully.

Meanwhile, Patent Document No. 3 discloses an image sensor that can minimize the loss of light by using a micro prism. Such an image sensor has a structure in which the incoming light is dispersed by the micro prism into red, green and blue rays to be received by three different photosensitive cells. Even when such an image sensor is used, the optical loss can also be minimized.

According to the techniques disclosed in Patent Documents Nos. 2 and 3, however, the number of photosensitive cells to provide needs to be as many as that of the dichroic mirrors to use or that of the color components to produce by dispersing the incoming light. That is why to detect light rays in the three primary colors of RGB, for example, the number of photosensitive cells provided should be tripled compared to a situation where traditional color filters are used, which is a problem.

Thus, to overcome such problems with the related art, Patent Document No. 4 discloses a technique for increasing the optical efficiency by using dichroic mirrors and reflected light, although some loss of the incoming light is involved. FIG. 12 is a partial cross-sectional view of an image sensor that adopts such a technique. As shown in FIG. 12, dichroic mirrors 22 and 23 are embedded in a light-transmitting resin 21. Specifically, the dichroic mirror 22 has such a property as to transmit a G ray and reflect R and B rays, while the dichroic mirror 23 has such a property as to transmit an R ray and reflect G and B rays.

Such a structure cannot receive a B ray at its photosensing section but can sense R and G rays entirely under the following principle. First, if an R ray impinges on the dichroic mirrors 22 and 23, the R ray is reflected from the dichroic mirror 22 but transmitted through the dichroic mirror 23. The R ray that has been reflected from the dichroic mirror 22 is also reflected from the interface between the light-transmitting resin 21 and the air, and then strikes the dichroic mirror 23. Then, the R ray is transmitted through the dichroic mirror 23 and then also transmitted through an organic dye filter 25 and a micro lens 26 that transmit the R ray. In this manner, even though only a part of the light is reflected from a metal layer 27, almost all of the R ray that has impinged on the dichroic mirrors 22 and 23 is incident on the photosensing section. On the other hand, if a G ray impinges on the dichroic mirrors 22 and 23, the G ray is transmitted through the dichroic mirror 22 but reflected from the dichroic mirror 23. The G ray that has been reflected from the dichroic mirror 23 is also totally reflected from the interface between the light-transmitting resin 21 and the air, and then strikes the dichroic mirror 22. Then, the G ray is transmitted through the dichroic mirror 22 and then also transmitted through an organic dye filter 24 and a micro lens 26 that transmit the G ray. In this manner, even though only a part of the light is reflected from the metal layer 27, almost all of the G ray that has impinged on the dichroic mirrors 22 and 23 is incident on the photosensing section almost without causing loss.

According to the technique disclosed in Patent Document No. 4, only one of the three color rays of RGB is lost but light rays of the other two colors can be received with almost no loss based on the principle described above. That is why there is no need to provide photosensing sections for all of the three colors of RGB. In this case, comparing such an image sensor to the one that does not use any dichroic mirrors but uses only organic dye filters to realize a color representation, it can be seen that the image capturing sensitivity can be doubled by this technique. This is because the optical efficiency achieved by using only organic dye filters is approximately one-third but the optical efficiency achieved by adopting the technique disclosed in Patent Document No. 4 is approximately two-thirds of the entire incoming light. Nevertheless, even if such a technique is adopted, one out of the three colors should be sacrificed. Furthermore, Patent Document No. 5 discloses a color representation technique for improving, by providing dispersing elements for photosensitive cells, the optical efficiency without significantly increasing the number of photosensitive cells to use. According to such a technique, each of the dispersing elements provided for the photosensitive cells disperses the incoming light into multiple light rays and makes those light rays incident on the photosensitive cells according to their wavelength ranges. In this case, each of the photosensitive cells receives combined light rays, in which multiple components falling within mutually different wavelength ranges have been superposed one upon the other, from multiple dispersing elements. As a result, a color signal can be generated by performing a signal arithmetic operation on the photoelectrically converted signals supplied from the respective photosensitive cells.

CITATION LIST

Patent Literature

Patent Document No. 1: Japanese Laid-Open Patent Publication No. 59-90467
Patent Document No. 2: Japanese Laid-Open Patent Publication No. 2000-151933
Patent Document No. 3: Japanese Laid-Open Patent Publication No. 2001-309395
Patent Document No. 4: Japanese Laid-Open Patent Publication No. 2003-78917
Patent Document No. 5: PCT International Application Publication No. 2009/153937
Patent Document No. 6: Japanese Laid-Open Patent Publication No. 59-137909

SUMMARY OF INVENTION

Technical Problem

To sum up, according to the traditional technologies, if light-absorbing color filters are used, the number of photosensitive cells to provide does not have to be increased significantly but the optical efficiency achieved will be low. Nevertheless, if dichroic mirrors or micro prisms are used as in the techniques disclosed in Patent Document Nos. 2 to 4, then the optical efficiency will be high but the number of photosensitive cells to provide should be increased considerably.

Meanwhile, according to the technique disclosed in Patent Document No. 5, a color image can be certainly obtained with the optical efficiency improved, theoretically speaking. However, it is difficult to make a dispersing element with an ideal light-dispersing property. And if the material property and product precision of the dispersing element are low, then the photoelectrically converted signal to be eventually output from each photosensitive cell does not become an ideal signal, either, and the color reproducibility of the resultant color image will be low, which is a serious problem.

Thus, an embodiment of the present invention provides a color image capturing technique that contributes to not only improving the optical efficiency without increasing the number of photosensitive cells to provide significantly but also achieving good color reproducibility.

Solution to Problem

To overcome such a problem, a solid-state image sensor according to one aspect of the present invention includes a photosensitive cell array, in which a number of unit blocks are arranged two-dimensionally. Each unit block includes first, second, third and fourth photosensitive cells. The image sensor also includes a dispersing element array that is arranged so as to face the photosensitive cell array and that includes a plurality of dispersing elements. If light that would be directly incident on each photosensitive cell, were it not for the dispersing element array, is called that photosensitive cell's entering light, the dispersing element array is configured to make light that is obtained by subtracting a light ray with a first color component from the first photosensitive cell's entering light and adding a light ray with a second color component to the remainder, incident on the first photosensitive cell. The dispersing element array also makes light that is obtained by subtracting the light ray with the second color component from the second photosensitive cell's entering light and adding the light ray with the first color component to the remainder, incident on the second photosensitive cell. The dispersing element array further makes light that is obtained by subtracting the light ray with the third color component from the third photosensitive cell's entering light and adding the light rays with the first and second color components to the remainder, incident on the third photosensitive cell. And the dispersing element array further makes light that is obtained by subtracting the light rays with the first and second color components from the fourth photosensitive cell's entering light and adding the light ray with the third color component to the remainder, incident on the fourth photosensitive cell.

A signal processing method according to another aspect of the present invention is a method for processing output signals of the solid-state image sensor described above. The method includes the steps of: (A) getting first, second, third and fourth photoelectrically converted signals from the first, second, third and fourth photosensitive cells, respectively; and (B) generating color information based on the first through fourth photoelectrically converted signals.

This general and particular embodiment can be implemented as a system, a method, a computer program or a combination thereof.

Advantageous Effects of Invention

A solid-state image sensor and image capture device according to the present invention uses a dispersing element that makes an incoming light ray incident on any of multiple different photosensitive cells according to its color component, thereby capturing a color image with higher optical efficiency and higher color reproducibility than previously even without significantly increasing the number of photosensitive cells to use.

BRIEF DESCRIPTION OF DRAWINGS

[FIG. 2] (*a*) is a plan view illustrating an exemplary unit pixel block of a solid-state image sensor according to the present invention and (*b*) and (*c*) are cross-sectional views as respectively viewed on the planes A-A' and B-B'.

[FIG. 5] (*a*) and (*b*) illustrate two exemplary pixel arrangements for an image sensor according to the first embodiment of the present invention.

[FIG. 9] (*a*) is a plan view illustrating the basic structure of another image sensor according to the first embodiment of the present invention and (*b*) and (*c*) are cross-sectional views as respectively viewed on the planes A-A' and B-B'.

[FIG. 10] (*a*) is a plan view illustrating the basic structure of an image sensor according to a second embodiment of the present invention and (*b*) and (*c*) are cross-sectional views as respectively viewed on the planes C-C' and D-D'.

Figure 1:
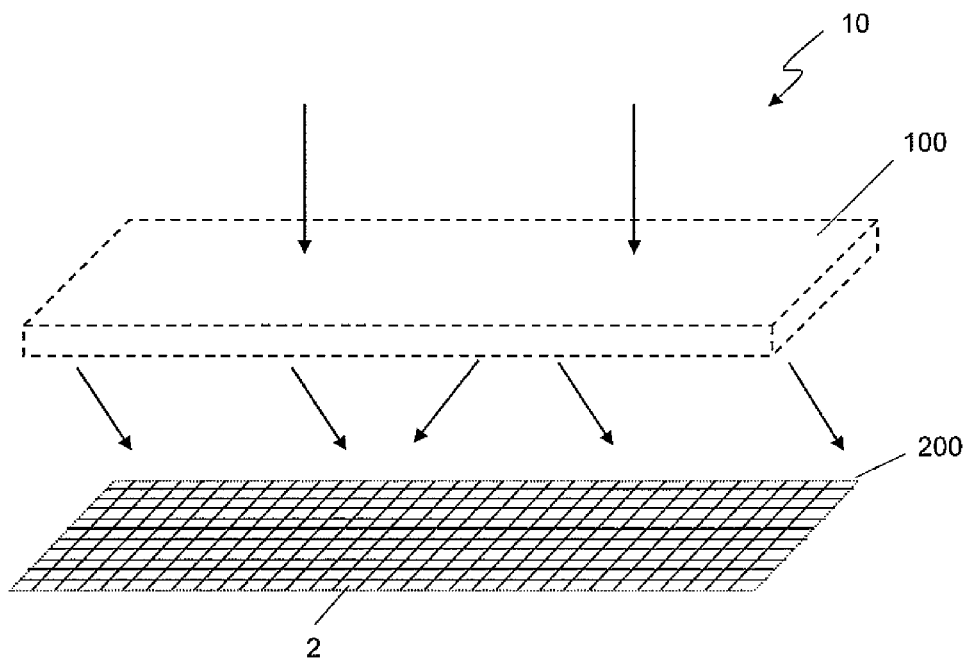
[FIG. 1A] perspective view schematically illustrating a relative arrangement of photosensitive cells 200 and dispersing elements 100 in a solid-state image sensor according to the present invention.

DESCRIPTION OF EMBODIMENTS (1) To overcome the problems described above, a solid-state image sensor according to one aspect of the present invention includes a photosensitive cell array, in which a number of unit blocks are arranged two-dimensionally. Each unit block includes first, second, third and fourth photosensitive cells. The image sensor also includes a dispersing element array that is arranged so as to face the photosensitive cell array and that includes a plurality of dispersing elements. If light that would be directly incident on each photosensitive cell, were it not for the dispersing element array, is called that photosensitive cell's entering light, the dispersing element array is configured to make light that is obtained by subtracting a light ray with a first color component from the first photosensitive cell's entering light and adding a light ray with a second color component to the remainder, incident on the first photosensitive cell. The dispersing element array also makes light that is obtained by subtracting the light ray with the second color component from the second photosensitive cell's entering light and adding the light ray with the first color component to the remainder, incident on the second photosensitive cell. The dispersing element array further makes light, which is obtained by subtracting the light ray with the third color component from the third photosensitive cell's entering light and adding the light rays with the first and second color components to the remainder, incident on the third photosensitive cell. And the dispersing element array further makes light, which is obtained by subtracting the light rays with the first and second color components from the fourth photosensitive cell's entering light and adding the light ray with the third color component to the remainder, incident on the fourth photosensitive cell.

(2) In one embodiment, the dispersing element array includes first, second, third and fourth dispersing elements, which are arranged so as to face first, second, third and fourth photosensitive cells, respectively, in each unit block. The first dispersing element makes at least a part of the light ray with the first color component incident on the second photosensitive cell and also makes the rest of the incoming light other than the light ray with the first color component incident on the first photosensitive cell. The second dispersing element makes at least a part of the light ray with the second color component incident on the first photosensitive cell and also makes the rest of the incoming light other than the light ray with the second color component incident on the second photosensitive cell. The third dispersing element makes at least apart of the light ray with the third color component incident on the fourth photosensitive cell and also makes the rest of the incoming light other than the light ray with the third color component incident on the third photosensitive cell. The fourth dispersing element makes at least respective parts of the light rays with the first and second color components incident on the third photosensitive cell and also makes the light ray with the third color component incident on the fourth photosensitive cell.

(3) In one embodiment of the solid-state image sensor of (2), the first dispersing element makes one and the other halves of the light ray with the first color component incident on its associated second photosensitive cell and one of the photosensitive cells of a first adjacent unit block, respectively. The second dispersing element makes one and the other halves of the light ray with the second color component incident on its associated first photosensitive cell and one of the photosensitive cells of a second adjacent unit block, respectively. The third dispersing element makes one and the other halves of the light ray with the third color component incident on its associated fourth photosensitive cell and one of the photosensitive cells of one of the first and second adjacent unit blocks, respectively. And the fourth dispersing element makes one and the other halves of the light rays with the first and second color components incident on its associated third photosensitive cell and one of the photosensitive cells of the other of the first and second adjacent unit blocks, respectively.

(4) In one embodiment of the solid-state image sensor of (2), the first dispersing element makes almost all of the light ray with the first color component incident on the second photosensitive cell. The second dispersing element makes almost all of the light ray with the second color component incident on the first photosensitive cell. The third dispersing element makes almost all of the light ray with the third color component incident on the fourth photosensitive cell. And the fourth dispersing element makes almost all of the light rays with the first and second color components incident on the third photosensitive cell.

(5) In one embodiment of the solid-state image sensor of one of (1) to (4), the first color component is one of colors red and blue components, the second color component is the other of the colors red and blue components, and the third color component is a color green component.

(6) In one embodiment of the solid-state image sensor of one of (1) to (5), each of the first, second, third and fourth dispersing elements has a light-transmitting member, and disperses the incoming light by using the shape of the light-transmitting member and a difference in refractive index between that light-transmitting member and another light-transmitting member that has a lower refractive index than the former light-transmitting member.

(7) In one embodiment of the solid-state image sensor of one of (1) to (5), each of the first, second, third and fourth dispersing elements includes a dichroic mirror and disperses the incoming light using the dichroic mirror.

(8) An image capture device according to an aspect of the present invention includes the solid-state image sensor of one of (1) to (7); an optical system that produces an image on the solid-state image sensor; and a signal processing section that processes signals supplied from the solid-state image sensor and that generates color information by performing arithmetic operations on first, second, third and fourth photoelectrically converted signals that have been supplied from the first, second, third and fourth photosensitive cells, respectively.

(9) In one embodiment of the image capture device of (8), the signal processing section generates first and second color difference signals by performing arithmetic operations, including addition and subtraction, on a first differential signal representing the difference between the first and second photoelectrically converted signals and on a second differential signal representing the difference between the third and fourth photoelectrically converted signals.

(10) In one embodiment of the image capture device of (8) or (9), by performing an arithmetic operation that involves adding together the first and second photoelectrically converted signals, or the third and fourth photoelectrically converted signals, or the first through fourth photoelectrically converted signals, the signal processing section generates a luminance signal.

(11) A signal processing method according to an aspect of the present invention is a method for processing output signals of the solid-state image sensor of one of (1) to (7). The method includes the steps of: (A) getting first, second, third and fourth photoelectrically converted signals from the first, second, third and fourth photosensitive cells, respectively; and (B) generating color information based on the first through fourth photoelectrically converted signals.

(12) In one embodiment of the signal processing method of (11), the step (B) includes the steps of: generating a first differential signal representing the difference between the first and second photoelectrically converted signals; generating a second differential signal representing the difference between the third and fourth photoelectrically converted signals; and performing an arithmetic operation including addition and subtraction on the first and second differential signals, thereby generating first and second color difference signals.

(13) In one embodiment of the signal processing method of (12), the step (B) includes the steps of: performing an arithmetic operation that involves adding together the first and second photoelectrically converted signals, or the third and fourth photoelectrically converted signals, or the first through fourth photoelectrically converted signals, thereby generating a luminance signal, and generating colors red, green and blue signals included in the cell's entering light based on the luminance signal and the first and second color difference signals.

First of all, the fundamental principle of an embodiment of the present invention will be described with reference to FIGS. 1 and 2 before its specific embodiments are described. In the following description, to spatially disperse incident light into multiple components of light falling within mutually different wavelength ranges or having respectively different color components will be referred to herein as "dispersing of light".

A solid-state image sensor as an embodiment of the present invention includes a photosensitive cell array in which photosensitive cells (pixels) are arranged two-dimensionally on an imaging area and a dispersing element array including a number of dispersing elements. FIG. 1 is a perspective view illustrating respective portions of a photosensitive cell array 200 and a dispersing element array 100, which are stacked in this order on the imaging area of a solid-state image sensor 10. The dispersing element array 100 is arranged so as to face the photosensitive cell array 200 and to receive the incoming light. It should be noted that the photosensitive cells 2 do not have to have such an arrangement, shape or size as the one shown in FIG. 1 but may also have any other known arrangement, shape or size. Also, the dispersing element array is illustrated in FIG. 1 as a quadrangular prism for convenience sake but actually does not always have such a shape but may have any of various other structures as well.

On receiving incoming light, each photosensitive cell 2 performs photoelectric conversion on the light and outputs an electrical signal representing the intensity (or the quantity) of the light received. Such an electrical signal will be referred to herein as a "photoelectrically converted signal" or a "pixel signal". According to an embodiment of the present invention, each photosensitive cell 2 receives multiple light rays that fall within multiple different wavelength ranges (i.e., light rays with multiple different color components) and that have had their traveling direction changed by the dispersing element array 100. As a result, the light actually received by each photosensitive cell 2 has multiple distribution of dispersed light rays (i.e., multiple intensity distributions associated with respective wavelength ranges), which are different from those of the light that would be received were it not for the dispersing elements.

Hereinafter, the basic structure of this image sensor 10 will be described with reference to FIG. 2.

FIG. 2 (a) is a plan view illustrating an exemplary basic pixel structure (which will be referred to herein as a "unit block") 40 of the photosensitive cell array 200. The photosensitive cell array 200 has a structure in which number of unit blocks 40, each including four photosensitive cells 2a, 2b, 2c and 2d, are arranged two-dimensionally on an imaging area. In the example illustrated in FIG. 2(a), four photosensitive cells are arranged in two columns and two rows in each unit block.

FIGS. 2(b) and 2(c) are schematic cross-sectional views as respectively viewed on the planes A-A' and B-B' shown in FIG. 1(a). As shown in FIGS. 2(b) and 2(c), each incoming light ray that has entered this image sensor 10 has its traveling direction changed according to its color component while being transmitted through the dispersing element array 100, and therefore, the light rays received by respective photosensitive cells have mutually different dispersed light distributions. In this description, the light that would be directly received by each photosensitive cell were it not for the dispersing element array 1 will be referred to herein as "cell's entering light". If the photosensitive cells 2a through 2d included in each single unit block are located close to each other, then those photosensitive cells' entering light should have almost the same light intensity distribution and substantially the same dispersed light distribution. The intensity of the visible radiation component of each of those photosensitive cells' entering light will be identified herein by the sign "W". In this description, the visible radiation component included in the cell's entering light will be roughly classified into first, second and third color components. That is to say, if the intensities of the first, second and third color components are identified by C1, C2 and C3, respectively, then W=C1+C2+C3. Also, the sum of the first and second color components is supposed herein to be the fourth color component (with an intensity C4). That is to say, the fourth color component is a component representing the complementary color of the third color component and has its intensity given by C4=C1+C2. A typical combination of the first, second and third color components consists of the three primary colors of red (R), green (G) and blue (B). However, as long as visible radiation can be divided into three light rays falling within mutually different wavelength ranges, any other combination of color components may be adopted as well.

Hereinafter, it will be described how the dispersing element array 100 of this embodiment of the present invention works. The dispersing element array 100 makes light, which is obtained by subtracting a light ray with a first color component (with an intensity C1) from the first photosensitive cell's (2a) entering light (with an intensity W) and adding a light ray with a second color component (with an intensity C2) to the remainder, incident on the first photosensitive cell 2a. The dispersing element array 100 also makes light, which is obtained by subtracting the light ray with the second color component (with an intensity C2) from the second photosensitive cell's (2b) entering light (with an intensity W) and adding the light ray with the first color component (with the intensity C1) to the remainder, incident on the second photosensitive cell 2b. The dispersing element array 100 further makes light, which is obtained by subtracting the light ray with the third color component (with an intensity C3) from the third photosensitive cell's (2c) entering light (with an intensity W) and adding a light ray with the fourth color component (i.e., light rays with the first and second color components) (intensity C4=C1+C2) to the remainder, incident on the third photosensitive cell 2c. And the dispersing element array 100 further makes light, which is obtained by subtracting the light ray with the fourth color component (with the intensity C4=C1+C2) from the fourth photosensitive cell's (2d) entering light (with an intensity W) and adding a light ray with the third color component (with an intensity C3) to the remainder, incident on the fourth photosensitive cell 2d.

Consequently, the photosensitive cells 2a through 2d receive light rays, of which the intensities are represented by W−C1+C2, W+C1−C2, W−C3+C4 and W+C3−C4, respectively, as shown in FIGS. 2(b) and 2(c). The respective photosensitive cells output photoelectrically converted signals (as pixel signals) representing those intensities. In this description, the photoelectrically converted signals supplied from the photosensitive cells 2a to 2d will be identified herein by S2a, S2b, S2c and S2d, respectively, and signals representing the intensities W, C1, C2, C3 and C4 will be identified herein by Ws, C1s, C2s, C3s and C4s, respectively. And C4s=C1s+C2s is supposed to be satisfied. Then S2a, S2b, S2c and S2d are represented by the following Equations (1) to (4), respectively:

$$S2a = Ws - C1s + C2s \tag{1}$$

$$S2b = Ws + C1s - C2s \tag{2}$$

$$S2c = Ws - C3s + C4s \tag{3}$$

$$S2d = Ws + C3s - C4s \tag{4}$$

The difference D1 between the signals S2a and S2b and the difference D2 between the signals S2c and S2d can be calculated by the following Equations (5) and (6), respectively:

$$D1 = S2b - S2a = 2C1s - 2C2s \tag{5}$$

$$D2 = S2c - S2d = 2C4s - 2C3s = 2(C1s + C2s) - 2C3s \tag{6}$$

Furthermore, by performing addition and subtraction on D1 and D2, the following Equations (7) and (8) are obtained:

$$D1 + D2 = 2(2C1s - C3s) \tag{7}$$

$$D2 - D1 = 2(2C2s - C3s) \tag{8}$$

That is to say, if color difference components are calculated by (2C1s−C3s) and (2C2s−C3s), then color difference signals which are twice as large as the color difference components can be obtained.

Meanwhile, by adding together S2a and S2b or S2c and S2d or S2a, S2b, S2c and S2d, a signal, of which the intensity is twice or four times as high as the intensity W of the cell's entering light, can be obtained as represented by the following Equations (9) to (11):

$$S2a + S2b = 2Ws \tag{9}$$

$$S2c + S2d = 2Ws \tag{10}$$

$$S2a + S2b + S2c + S2d = 4Ws \tag{11}$$

These signals correspond to signals to be obtained if the entire incoming light has been photoelectrically converted without loss. That is why if any of these signal is used as a luminance signal, an ideal characteristic will be realized in terms of image capturing sensitivity.

Once the luminance signal is obtained by performing any of the arithmetic operations represented by Equations (9) to (11) and once two color difference signals are obtained by Equations (7) and (8), an RGB signal can be obtained by performing a matrix operation. That is to say, by performing a signal arithmetic operation on the four photoelectrically converted signals S2$a$ through S2$d$ supplied from the photosensitive cells 2$a$ through 2$d$, a color signal can be calculated.

The image sensor 10 of this embodiment of the present invention can obtain color information through such signal arithmetic operations by using dispersing elements instead of color filters that absorb a part of incoming light. As a result, the loss of the light can be minimized and the image capturing sensitivity can be increased. In addition, as can be seen from the right sides of Equations (1) to (4), any of the signals C1$s$ through C4$s$ is subjected to not only addition but also subtraction while each pixel signal is being generated. That is why when light with an intensity W is received, no signal value increases or decreases significantly only at a certain pixel. It can be said that this will contribute effectively to improving the dynamic range characteristic of the image sensor in response to the incoming light.

In FIGS. 1, 2($b$) and 2($c$), the dispersing element array 100 is illustrated as a single continuous member that covers multiple photosensitive cells. However, the dispersing element array 4 may also be a set of spatially separated dispersing elements. Examples of such dispersing elements include a high-refractive-index transparent member, a dichroic mirror and a micro prism as will be described later. Nevertheless, as long as the photoelectrically converted signals represented by Equations (1) to (4) are obtained, the dispersing element array 100 of this embodiment of the present invention may also have any other arrangement. For example, the incoming light may be dispersed with a hologram element, for example.

Hereinafter, specific embodiments of the present invention will be described with reference to FIGS. 3 through 10. In the following description, any pair of components having substantially the same function will be identified by the same reference numeral.

(Embodiment 1)

Figure 3:
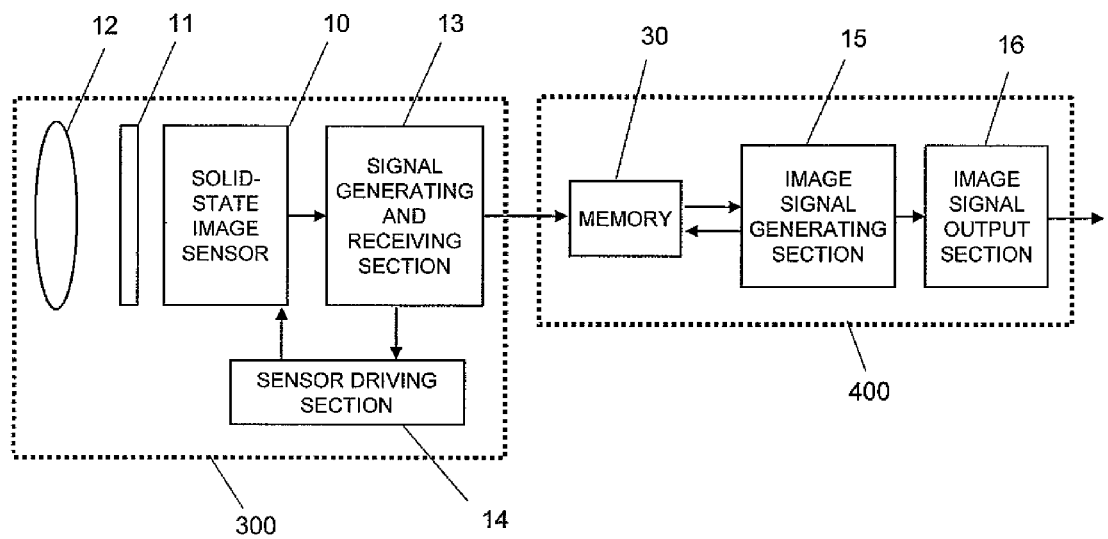
[FIG. 3] A block diagram illustrating a general configuration for an image capture device as a first embodiment of the present invention.

FIG. 3 is a block diagram illustrating an overall configuration for an image capture device as a first embodiment of the present invention. The image capture device of this embodiment is a digital electronic camera and includes an image capturing section 300 and a signal processing section 400 that receives a signal from the image capturing section 300 and outputs a signal representing an image (i.e., an image signal). The image capture device may either generate only a still picture or have the function of generating a moving picture.

The image capturing section 300 includes an optical lens 12 which images a given subject, an optical filter 11, and a solid-state image sensor 10 (which will be simply referred to herein as an "image sensor") which converts the optical information that has been gotten through the optical lens 12 and the optical filter 11 into an electrical signal by photoelectric conversion. The image capturing section 300 further includes a signal generating and receiving section 13, which not only generates a fundamental signal to drive the image sensor 10 but also receives the output signal of the image sensor 10 and sends it to the signal processing section 400 and a sensor driving section 14 which drives the image sensor 10 in accordance with the fundamental signal generated by the signal generating and receiving section 13. The optical lens 12 is a known lens and may be a lens unit including multiple lenses. The optical filters 11 are a combination of a quartz crystal low-pass filter which reduces a moiré pattern to be caused by a pixel arrangement with an infrared cut filter which filters out infrared rays. The image sensor 10 is typically a CMOS or a CCD, and may be fabricated by known semiconductor device processing technologies. The signal generating and receiving section 13 and the sensor driving section 14 may be implemented as an LSI such as a CCD driver.

The signal processing section 400 includes an image signal generating section 15 which generates an image signal by processing the signal supplied from the image capturing section 300, a memory 30 which stores various kinds of data that have been produced while the image signal is being generated, and an image signal output section 16 which sends out the image signal thus generated to an external device. The image signal generating section 15 is suitably a combination of a hardware component such as a known digital signal processor (DSP) and a software program for use to perform image processing involving the image signal generation. The memory 30 may be a DRAM, for example. And the memory 30 not only stores the signal supplied from the image capturing section 300 but also temporarily retains the image data that has been generated by the image signal generating section 15 or compressed image data. These image data are then output to either a storage medium or a display section (neither is shown) by way of the image signal output section 16.

The image capture device of this embodiment actually further includes an electronic shutter, a viewfinder, a power supply (or battery), a flashlight and other known components. However, description thereof will be omitted herein because none of them are essential components that would make it difficult to understand how the present invention works unless they were described in detail. It should also be noted that this configuration is just an example. Rather, the present invention may also be carried out as any other appropriate combination of known elements as long as the image sensor 10 and the image signal generating section 15 are included.

Hereinafter, the solid-state image sensor 10 of this embodiment will be described.

Figure 4:
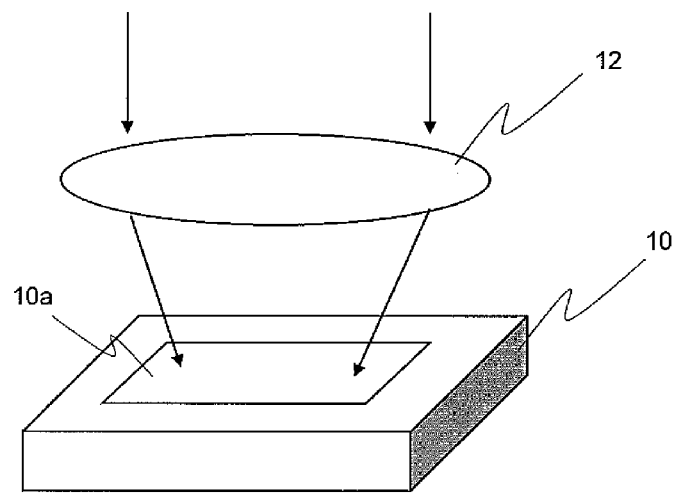
[FIG. 4] Illustrates how a lens and an image sensor may be arranged in the first embodiment of the present invention.

FIG. 4 schematically illustrates how the light that has been transmitted through the lens 12 is incident on the image sensor 10 during an exposure process. In FIG. 4, shown are only the lens 12 and the image sensor 10 with illustration of the other components omitted for the sake of simplicity. Also, although the lens 12 actually often consists of a number of lenses that are arranged in the optical axis direction, the lens 12 shown in FIG. 4 is illustrated as a single lens in a simplified form. On the imaging area 10$a$ of the image sensor 10, arranged two-dimensionally are a number of photosensitive cells (pixels) that form a photosensitive cell array. Those photosensitive cells are typically photodiodes, each of which outputs, as a pixel signal, a photoelectrically converted signal representing the intensity of the light received (which will be referred to herein as an "incident light intensity"). The light (visible radiation) that has been transmitted through the lens 12 and the optical filter 11 is incident on the imaging area 10$a$. Generally speaking, the intensity of the light impinging on the imaging area 10$a$ and the distribution of the quantities of incoming light rays that fall within multiple different wavelength ranges (which will be referred to herein as a "dispersed light distribution") vary from one point of incidence to another.

FIGS. 5($a$) and 5($b$) are plan views illustrating arrangements of pixels according to this embodiment. As shown in FIG. 5($a$), the photosensitive cell array 200 may be made up of a number of photosensitive cells that are arranged on the imaging area 10$a$ to form a tetragonal lattice. The photosensitive cell array 200 is divided into a number of unit blocks 40, each of which consists of four photosensitive cells 2a, 2b, 2c and 2d. Alternatively, the photosensitive cells may also have an oblique lattice arrangement as shown in FIG. 4(b), instead of the tetragonal lattice arrangement shown in FIG. 5(a), or any other appropriate arrangement. Furthermore, it is recommended that the four photosensitive cells 2a to 2d included in each unit block be arranged close to each other as shown in FIGS. 5(a) and 5(b). However, even if those photosensitive cells 2a to 2d were well spaced from each other, color information could still be obtained by forming appropriately the dispersing element array to be described later. If necessary, each unit block may even have five or more photosensitive cells as well.

The dispersing element array consisting of multiple dispersing elements is arranged on the light incident side so as to face the photosensitive cell array 200. According to this embodiment, four dispersing elements are arranged so as to respectively face the four photosensitive cells that are included in each unit block.

Hereinafter, the dispersing elements of this embodiment will be described.

The dispersing element of this embodiment is an optical element which refracts incoming light to multiple different directions according to the wavelength range by utilizing diffraction of the light to produce on the boundary between two different light-transmitting members with mutually different refractive indices. The dispersing element of that type includes high-refractive-index transparent portions (core portions), which are made of a material with a relatively high refractive index, and low-refractive-index transparent portions (clad portions), which are made of a material with a relatively low refractive index and which contact with side surfaces of the core portions. Since the core portion and the clad portion have mutually different refractive indices, a phase difference is caused between the light rays that have been transmitted through the core and clad portions, thus producing diffraction. And since the magnitude of the phase difference varies according to the wavelength of the light, the incoming light can be spatially separated according to the wavelength range into multiple light rays with respective color components. For example, one and the other halves of a light ray with a first color component can be refracted toward first and second directions, respectively, and a light ray with a color component other than the first color component can be refracted toward a third direction. Alternatively, three light rays with mutually different color components could be refracted toward three different directions, too. Since the incoming light can be dispersed due to the difference in refractive index between the core and clad portions, the high-refractive-index transparent portion will sometimes be referred to herein as a "dispersing element". Such diffractive dispersing elements are disclosed in Japanese Patent Publication No. 4264465, for example.

A dispersing element array, including such dispersing elements, may be fabricated by performing thin-film deposition and patterning processes by known semiconductor device processing technologies. By appropriately determining the material (and refractive index), shape, size and arrangement pattern of the dispersing elements, multiple light rays falling within intended wavelength ranges can be made to be incident on respective photosensitive cells either separately from each other or combined together. As a result, signals representing required color components can be calculated based on a set of photoelectrically converted signals supplied from the respective photosensitive cells.

Hereinafter, it will be described with reference to FIG. 6 what the basic structure of the image sensor 10 of this embodiment is like and how the dispersing elements work.

FIG. 6(a) is a plan view illustrating the basic structure of the image sensor 10. In each unit block, four dispersing elements 1a, 1b, 1c and 1d are arranged so as to face the four photosensitive cells 2a, 2b, 2c and 2d, respectively. A number of basic structures, each having the same arrangement pattern like this, are arranged over the entire imaging area 10a.

FIGS. 6(b) and 6(c) are cross-sectional views of the image sensor 10 shown in FIG. 6(a) as viewed on the planes A-A' and B-B', respectively. As shown in FIGS. 6(a) and 6(b), the image sensor 10 includes: a semiconductor substrate 7 made of silicon or any other suitable material; photosensitive cells 2a through 2d, which are arranged in the semiconductor substrate 7; an interconnect layer 5 and a transparent layer 6a of a low-refractive-index transparent material, which have been stacked in this order on the principal surface of the semiconductor substrate 7 (i.e., on the light incident side); and dispersing elements 1a, 1b, 1c and 1d, which are made of a high-refractive-index transparent material and arranged in the transparent layer 6a. In addition, micro lenses 4a that condense the incoming light toward the photosensitive cells efficiently are also arranged to face the respective photosensitive cells with the transparent layer 6a interposed between them. It should be noted that the effect of this embodiment can be achieved even with the micro lenses 4a omitted.

The structure shown in FIGS. 6(a) to 6(c) can be fabricated by known semiconductor device processing. The image sensor 10 shown in FIGS. 6(a) through 6(c) has a surface illumination structure in which light is incident on each photosensitive cell through the interconnect layer 5. However, the image sensor 10 of this embodiment does not have to have such a structure but may also have a backside illumination structure in which light is incident on the other side of the device opposite to the interconnect layer 5.

As shown in FIG. 6(b), each of the dispersing elements 1a and 1b has a rectangular cross section, which is elongated in the light-transmitting direction, and disperses the incoming light into multiple light rays by taking advantage of a difference in refractive index between itself and the transparent layer 6a. Specifically, the dispersing element 1a makes red (R) and green (G) rays incident on the photosensitive cell 2a that faces the element 1a and also makes one and the other halves of a blue (B) ray incident on the photosensitive cell 2b and on a photosensitive cell (not shown) of an adjacent unit block, respectively. On the other hand, the dispersing element 1b makes green (G) and blue (B) rays incident on the photosensitive cell 2b that faces the element 1b and also makes one and the other halves of a red (R) ray incident on the photosensitive cell 2a and on a photosensitive cell (not shown, either) of another adjacent unit block, respectively. According to this embodiment, the dispersing elements 1a and 1b have their length and thickness determined so as to have the light-dispersing property described above.

By using such dispersing elements 1a and 1b, the photosensitive cell 2a receives not only R and G rays from the dispersing element 1a but also one and the other halves of an R ray from the dispersing element 1b and a dispersing element of an adjacent unit block, respectively. The photosensitive cell 2b receives not only G and B rays from the dispersing element 1b but also one and the other halves of a B ray from the dispersing element 1a and a dispersing element (not shown) of an adjacent unit block, respectively.

As shown in FIG. 6(c), the dispersing elements 1c and 1d also have a rectangular cross section, which is elongated in the light-transmitting direction, and disperses the incoming light into multiple light rays by taking advantage of a difference in refractive index between itself and the transparent layer 6a. Specifically, the dispersing element 1c makes a magenta (M) ray incident on the photosensitive cell 2c that faces the element 1c and also makes one and the other halves of a green (G) ray incident on the photosensitive cell 2d and on a photosensitive cell (not shown) of an adjacent unit block, respectively. In this case, the magenta (M) ray is a combination of a red (R) ray and a blue (B) ray. On the other hand, the dispersing element 1d makes a green (G) ray incident on the photosensitive cell 2d that faces the element 1d and also makes one and the other halves of a magenta (M) ray incident on the photosensitive cell 2c and on a photosensitive cell (not shown, either) of another adjacent unit block, respectively. According to this embodiment, the dispersing elements 1c and 1d have their length and thickness determined so as to have the light-dispersing property described above.

As the incoming light has been dispersed in this manner by these dispersing elements 1a to 1d, the photosensitive cells 2a to 2d output photoelectrically converted signals S2a to S2d represented by the following Equations (12) to (15), where three signals representing the intensities of red, green and blue rays are identified by Rs, Gs and Bs, respectively, a signal Ms representing the intensity of a magenta ray is identified by Rs+Bs, and a signal Ws representing the intensity of white light is identified by Rs+Gs+Bs:

$$S2a = Ws - Bs + Rs = 2Rs + Gs \quad (12)$$

$$S2b = Ws + Bs - Rs = Gs + 2Bs \quad (13)$$

$$S2c = Ws - Gs + Ms = 2Ms = 2(Rs + Bs) \quad (14)$$

$$S2d = Ws + Gs - Ms = 2Gs \quad (15)$$

These Equations (12) through (15) are equivalent to what is obtained by replacing C1s, C2s, C3s and C4s with Bs, Rs, Gs and Ms, respectively, in Equations (1) through (4). That is to say, according to this embodiment, the first, second, third and fourth color components correspond to B, R, G and M rays, respectively.

Figure 7:
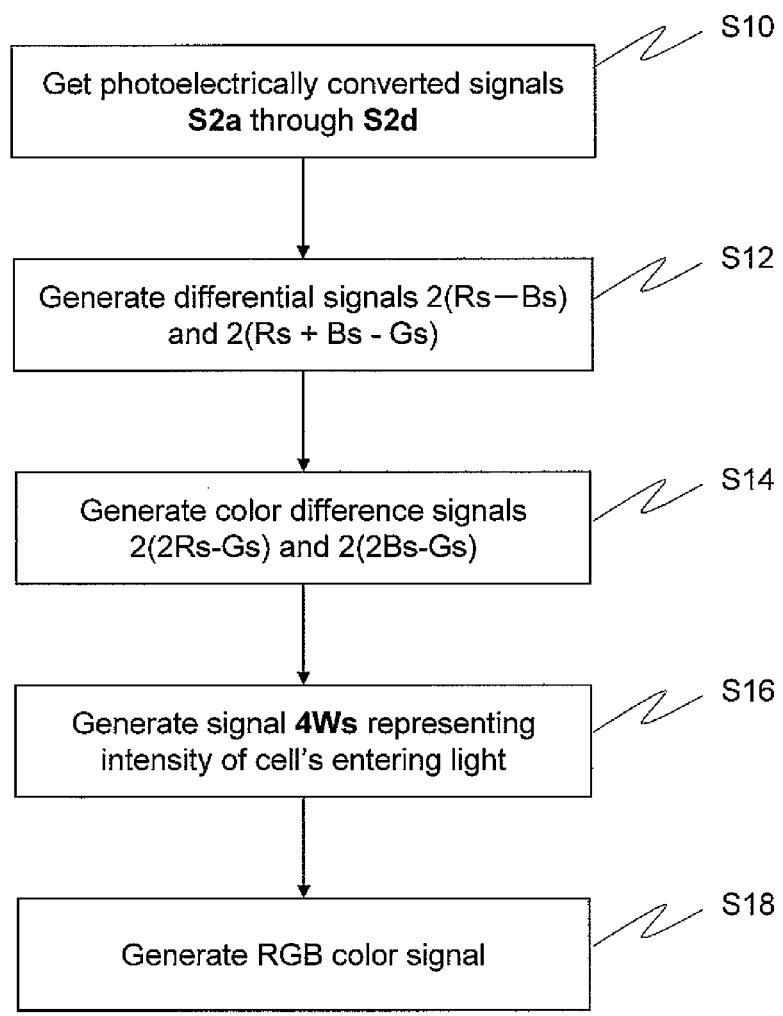
[FIG. 7] A flowchart showing the procedure of color information generation processing according to the first embodiment of the present invention.

The image signal generating section 15 (see FIG. 3) generates color information by performing arithmetic operations on the photoelectrically converted signals represented by these Equations (12) through (15). Hereinafter, it will be described with reference to FIG. 7 how the image signal generating section 15 performs such color information generation processing. FIG. 7 is a flowchart showing the procedure of color information generation processing according to this embodiment.

First of all, in Step S10, the image signal generating section 15 gets the photoelectrically converted signals S2a through S2d. Next, in Step S12, the image signal generating section 15 calculates (S2a−S2b) and (S2d−S2c), thereby generating 2(Rs−Bs) and 2(Rs+Bs−Gs), respectively. Then, in Step S14, the image signal generating section 15 adds and subtracts these two generated signals 2(Rs−Bs) and 2(Rs+Bs−Gs) to/from each other, thereby generating color difference signals 2(2Rs−Gs) and 2(2Bs−Gs). Subsequently, in Step S16, the pixel signals S2a through S2d are added together to obtain a signal 4(Rs+Gs+Bs)=4Ws representing the intensity of the cell's entering light, which is regarded as a luminance signal. Finally, in Step S18, an RGB color signal is obtained by performing a matrix computation on the two color difference signals and the one luminance signal.

A specific method for making a color representation using these color difference signals (2Rs−Gs) and (2Bs−Gs) is disclosed in Patent Document No. 6, for example. And the method disclosed in Patent Document No. 6 may be used in this embodiment, too. As long as these three pieces of information, namely, the two color difference signals and the one luminance signal, are available, the RGB signal can be calculated by performing a matrix computation.

The image signal generating section 15 performs these signal arithmetic operations on each and every unit block 40 of the photosensitive cell array 2, thereby generating image signals representing RGB color components (which will be referred to herein as "color image signals"). The color image signals thus generated are output by the image signal output section 16 to a storage medium or display section (not shown).

In this manner, the image capture device of this embodiment obtains color image signals by performing addition and subtraction processing on the photoelectrically converted signals S2a through S2d. Since the image sensor 10 of this embodiment uses no optical elements that absorb light, the loss of light can be cut down significantly compared to the existent technology that uses color filters or any other light-absorbing optical elements. In addition, color difference signals with higher levels than the ones disclosed in Patent Document No. 6 can be obtained, and therefore, the color reproducibility can be further improved.

As described above, in the image sensor 10 of this embodiment, a dispersing element array, which includes a number of unit matrices, each consisting of four elements that are arranged in two columns and two rows, is arranged to face a photosensitive cell array. In each unit matrix, a dispersing element 1a that disperses incoming light into a blue ray and non-blue rays is arranged at the row 1, column 1 position. A dispersing element 1b that disperses the incoming light into a red ray and non-red rays is arranged at the row 1, column 2 position. A dispersing element 1c that disperses the incoming light into a green ray and non-green rays is arranged at the row 2, column 1 position. And a dispersing element 1d that disperses the incoming light into a magenta ray and non-magenta rays is arranged at the row 2, column 2 position. A number of such unit matrices of dispersing elements are arranged to form a repetitive pattern on the imaging area. That is why even if a combination of unit blocks 40 to choose from the photosensitive cell array 200 is changed on a row-by-row or column-by-column basis, the four photoelectrically converted signals to be obtained will always be the same combination of four signals that are represented by Equations (12) through (15), respectively. That is to say, by performing the signal arithmetic operations described above with the target pixel blocks shifted either row by row or column by column, information about the RGB color components can be obtained from almost every single one of those pixels. This means that the resolution of the image capture device can be raised to approximately as high as the actual number of pixels. Consequently, the image capture device of this embodiment not only has higher sensitivity, but also can generate a color image with a higher resolution, than traditional image capture devices.

It should be noted that the image signal generating section 15 does not always have to generate all of the three image signals representing the three color components. Alternatively, the image signal generating section 15 may also be designed to generate image signal(s) representing only one or two color components depending on the intended application. Also, if necessary, the signals may be amplified, synthesized or corrected as well.

Ideally, the light-dispersing performance of the respective dispersing elements is exactly as described above. However, their light-dispersing performances could be somewhat different from each other. That is to say, the photoelectrically converted signals that are actually output from those photosensitive cells could be different to a certain degree from what is defined by Equations (12) to (15). Even if the light-dispersing performances of the respective dispersing elements are slightly different from the ideal ones, good color information can still be obtained by correcting the signals according to the magnitude of the difference.

Optionally, the signal arithmetic operations performed by the image signal generating section 15 of this embodiment may be performed by another device, not the image capture device itself. For example, the color information can also be generated by getting a program defining the signal arithmetic processing of this embodiment executed by an external device that has been provided with the photoelectrically converted signals by the image sensor 10. The basic structure of the image sensor 10 is not limited to the one illustrated in FIG. 6. For example, even if the dispersing elements 1a and 1b are changed with each other or if the dispersing elements 1c and 1d are changed with each other, the effect of this embodiment can also be achieved. Furthermore, the arrangements for the first and second rows shown in FIG. 6(a) may be changed with each other. Or the dispersing elements 1a and 1b and the dispersing elements 1c and 1d may also be arranged side by side in the column direction, instead of the row direction. Even so, the same effect can also be achieved.

Furthermore, the dispersing element array may have any other configuration as long as light rays represented by (2R+G), (G+2B), 2M (=2R+2B) and 2G are incident on the four photosensitive cells 2a, 2b, 2c and 2d, respectively, in each unit block 40. For example, the configuration shown in FIG. 8 may also be adopted.

Figure 8:
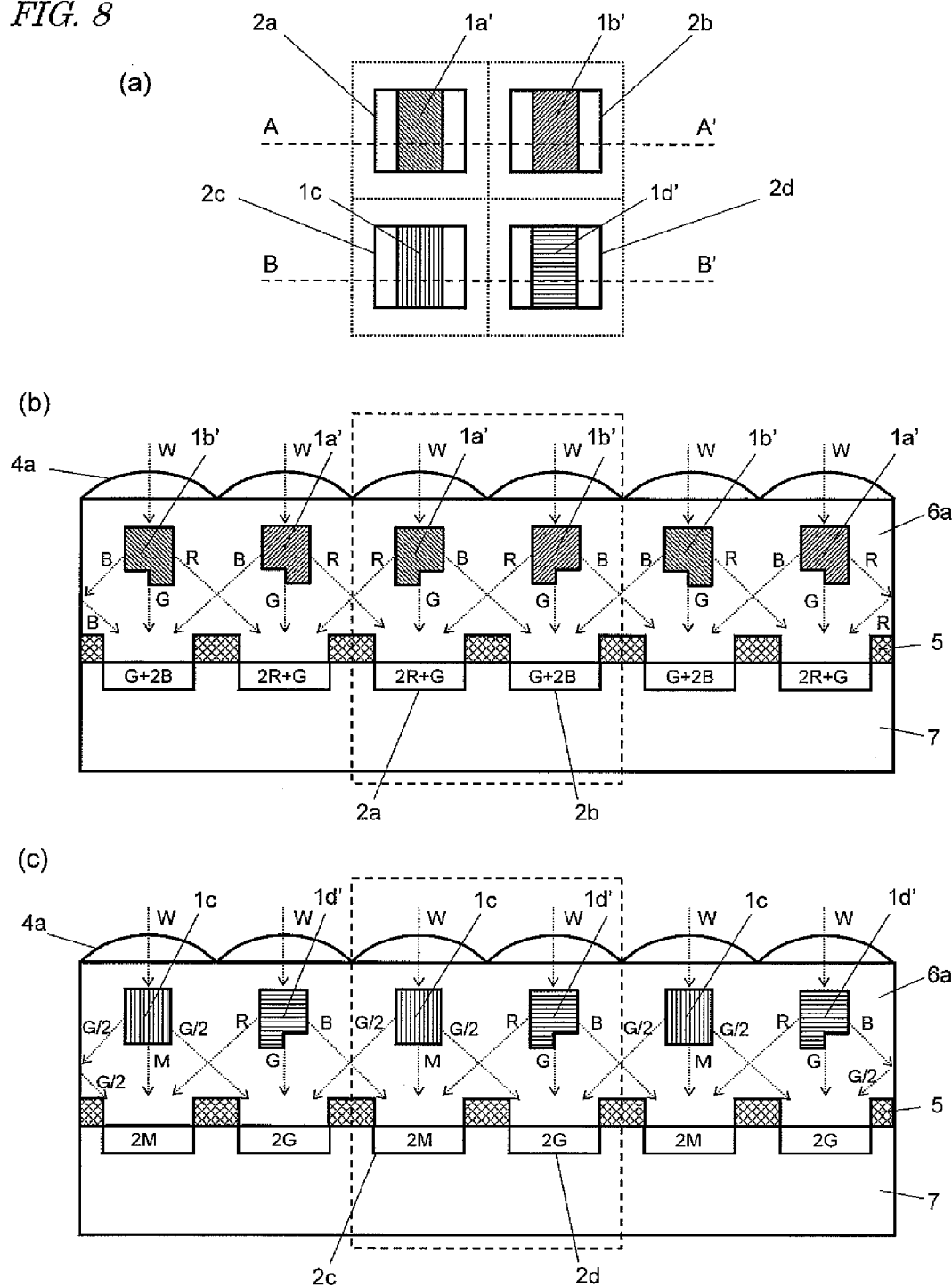
[FIG. 8] (*a*) is a plan view illustrating the basic structure of an image sensor according to a modified example of the first embodiment and (*b*) and (*c*) are cross-sectional views as respectively viewed on the planes A-A' and B-B'.
Figure 11:
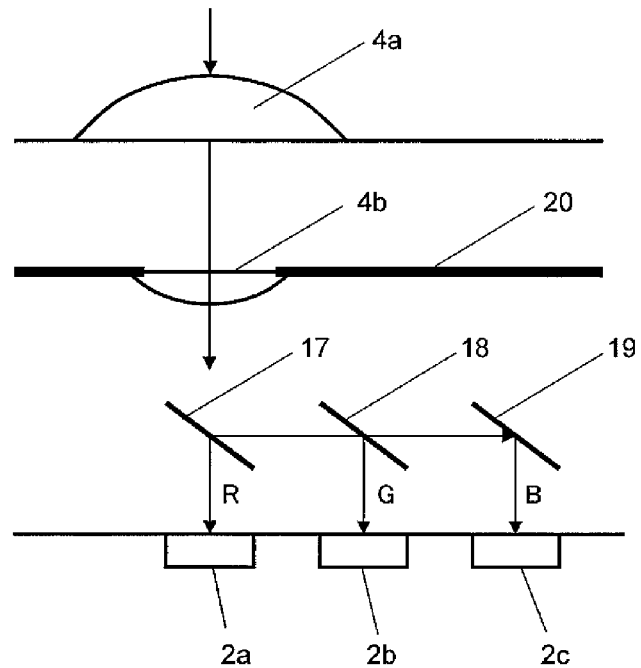
[FIG. 11] A cross-sectional view illustrating a traditional image sensor that uses micro lenses and multilayer filters (dichroic mirrors).
Figure 12:
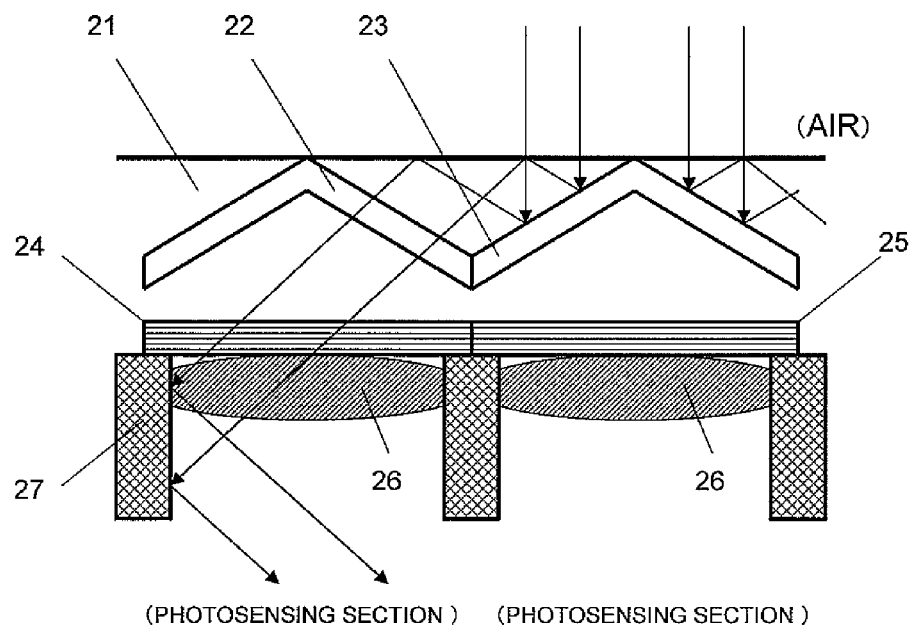
[FIG. 12] A cross-sectional view of another traditional image sensor that uses reflection by multilayer filters (dichroic mirrors).

FIG. 8 illustrates one modified example of this embodiment. Specifically, FIG. 8(a) is a plan view illustrating the basic structure of an image sensor 10 of this modified example, and FIGS. 8(b) and 8(c) are cross-sectional views as respectively viewed on the planes A-A' and B-B' shown in FIG. 8(a). In FIGS. 8(b) and 8(c), shown are not only a unit block of interest but also photosensitive cells included in two unit blocks that are adjacent to the unit block of interest and dispersing elements that face those photosensitive cells as well. In FIGS. 8(b) and 8(c), the dashed rectangle indicates a single unit element of the image sensor 10.

Figure 6:
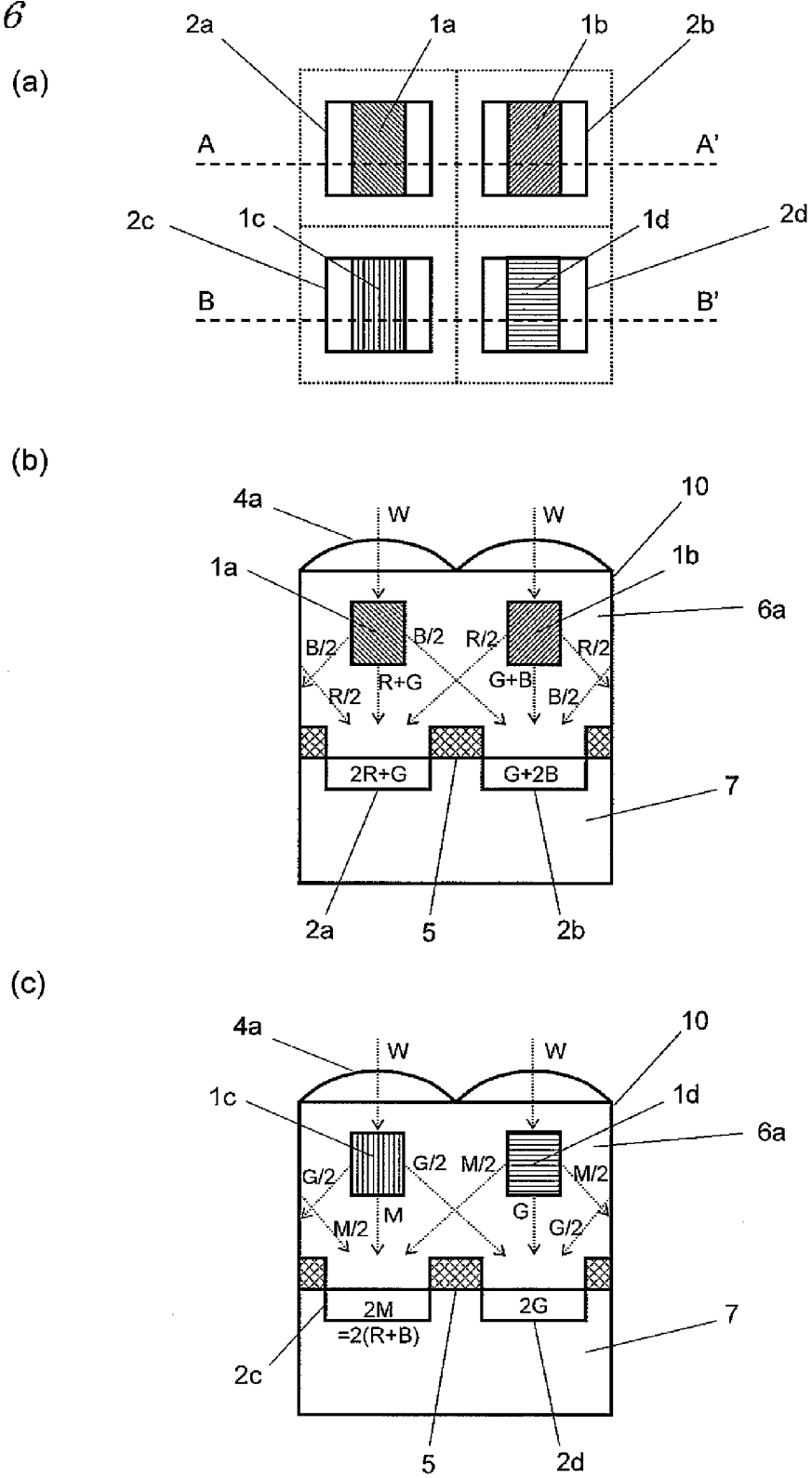
[FIG. 6] (*a*) is a plan view illustrating the basic structure of an image sensor according to the first embodiment of the present invention and (*b*) and (*c*) are cross-sectional views as respectively viewed on the planes A-A' and B-B'.

In this modified example, the dispersing elements 1a, 1b, and 1d shown in FIG. 6 are replaced with dispersing elements 1a', 1b' and 1d', respectively. Each of these dispersing elements 1a', 1b' and 1d' has a step at its light-outgoing end. And by taking advantage of a difference in refractive index between itself and the transparent layer 6a, the dispersing element disperses the incoming light into diffracted rays of various orders including zero-order, first-order, and minus-first-order ones. As the angle of diffraction of each of these rays varies with the wavelength, the dispersing element can disperse the incoming light into three light rays going in three different directions according to the color component.

As shown in FIG. 8(b), each of the dispersing elements 1a' and 1b' included in the unit element indicated by the dashed rectangle is configured to disperse the incoming light into light rays with the three color components of R, G and B. These dispersing elements 1a' and 1b' face the same direction and each make the G ray incident on the photosensitive cell that faces itself, make the R ray incident on an adjacent photosensitive cell on the left-hand side in FIG. 8, and make the B ray incident on an adjacent photosensitive cell on the right-hand side in FIG. 8. On the other hand, the two dispersing elements included in each adjacent unit element face the opposite direction to the one described above, and each make the G ray incident on the photosensitive cell that faces itself, make the R ray incident on an adjacent photosensitive cell on the right-hand side in FIG. 8, and make the B ray incident on an adjacent photosensitive cell on the left-hand side in FIG. 8. As a result, two light rays represented as (2R+G) and (G+2B) are incident on the photosensitive cells 2a and 2b, respectively. In this modified example, the arrangement of the photosensitive cells that receive light rays represented as (2R+G) and (G+2B) in one unit element is opposite to that of such photosensitive cells in each of the two adjacent unit elements on the right- and left-hand sides.

Likewise, as shown in FIG. 8(c), the dispersing element 1d' is also configured to disperse the incoming light into light rays with the three color components of R, G and B. This dispersing element 1d' is arranged to make the G ray incident on the photosensitive cell 2d that faces itself, make the R ray incident on an adjacent photosensitive cell on the left-hand side in FIG. 8, and make the B ray incident on an adjacent photosensitive cell on the right-hand side in FIG. 8. By adopting such a configuration, light rays represented as 2M and 2G are incident on the photosensitive cells 2c and 2d, respectively, as in the configuration shown in FIG. 6. As a result, color information can be obtained by performing the same processing as the configuration shown in FIG. 6.

In the foregoing description, an optical element that disperses incoming light into two by taking advantage of a difference in refractive index between two members is used as the dispersing element. However, a dispersing element according to the present invention may be anything else as long as it can make a light ray with an intended color component incident on each photosensitive cell. For example, a micro prism or a dichroic mirror may also be used as the dispersing element. Furthermore, multiple different kinds of dispersing elements may also be used in combination as well.

As an example, an arrangement for an image sensor, a portion of which uses a dichroic mirror to transmit and reflect light, is illustrated in FIG. 9. Specifically, FIG. 9(a) is a plan view illustrating the basic pixel arrangement of this example, and FIGS. 9(b) and 9(c) are cross-sectional views as respectively viewed on the planes A-A' and B-B' shown in FIG. 9(a). In this exemplary arrangement, the dispersing elements 1a and 1b shown in FIG. 6 are respectively replaced with dispersing elements 1e and 1f with a dichroic mirror. The dispersing elements 1c and 1d have the same property as the dispersing elements 1c and 1d shown in FIG. 6. The image sensor 10 shown in FIG. 9 has a backside illumination type structure in which incoming light is incident on the other side of the device opposite to the interconnect layer 5. However, this is not an essential feature but the image sensor 10 may have a surface illumination type structure as well.

As shown in FIGS. 9(b) and 9(c), the image sensor 10 includes: a semiconductor substrate 7 made of silicon or any other suitable material; photosensitive cells 2a through 2d, which are arranged in the semiconductor substrate 7; a transparent layer 6b, which is arranged on the back surface of the semiconductor substrate 7 (i.e., on the light incident side); and dispersing elements 1e, 1f, 1c and 1d, which are arranged in the transparent layer 6b. An interconnect layer 5 is arranged on the principal surface of the semiconductor substrate 7 (i.e., opposite to the light incident side). Furthermore, a supporting base 9 is arranged on the principal surface in order to support the semiconductor substrate 7, the interconnect layer 5 and so on. The supporting base 9 is bonded to the semiconductor substrate 7 with the transparent layer 6b interposed between them. The transparent layer 6b is made of a transparent material, of which the refractive index is higher than that of the air but lower than that of the dispersing elements 1c and 1d.

The dispersing element 1e includes two dichroic mirrors, each of which reflects a B ray and transmits the rest of the incoming light other than the B ray and which have been bonded together. Likewise, the dispersing element 1f also includes two dichroic mirrors, each of which reflects an R ray and transmits the rest of the incoming light other than the R ray and which have been bonded together. The two dichroic mirrors included in each dispersing element are arranged so as to define the same tilt angle with respect to a normal to the imaging area (i.e., arranged symmetrically to each other with respect to the normal). The tilt angle of these dichroic mirrors is defined so that the light reflected from the dichroic mirrors is totally reflected from the interface between this image sensor 10 and the air layer outside of the sensor and then incident on two pixels that are adjacent to the two pixels that face these dichroic mirrors.

If the incoming light is incident on the dispersing element 1e, its B ray is reflected but its R and G rays are transmitted. One half of the reflected B ray is totally reflected from the interface between the transparent layer 6b and the air and then incident on the photosensitive cell 2b. The other half of the reflected B ray is totally reflected from the interface between the transparent layer 6b and the air and then incident on a photosensitive cell of an adjacent unit block. On the other hand, the R and G rays that have been transmitted through the dispersing element 1e are incident on the photosensitive cell 2a.

If the incoming light is incident on the dispersing element 1f, its R ray is reflected but its G and B rays are transmitted. One half of the reflected R ray is totally reflected from the interface between the transparent layer 6b and the air and then incident on the photosensitive cell 2a. The other half of the reflected R ray is totally reflected from the interface between the transparent layer 6b and the air and then incident on a photosensitive cell of an adjacent unit block. On the other hand, the G and B rays that have been transmitted through the dispersing element 1f are incident on the photosensitive cell 2a.

As in the arrangement shown in FIG. 6, the dispersing element 1c makes M and G rays incident on the photosensitive cell 2c and a photosensitive cell of an adjacent unit block, respectively. The dispersing element 1d also makes G and M rays incident on the photosensitive cell 2d and a photosensitive cell of an adjacent unit block, respectively. The size and the shape of the dispersing elements 1c and 1d are determined in view of refraction at the interface between the transparent layer 6b and the semiconductor substrate 7.

Even when such an arrangement is adopted, the respective photosensitive cells 2a through 2d receive quite the same light rays as in a situation where the arrangement shown in FIG. 6 is adopted. That is why the photoelectrically converted signals output from the respective photosensitive cells 2a through 2d are also the same as in the arrangement shown in FIG. 6, and therefore, the signal arithmetic operations described above are also applicable to this example exactly as they are. Consequently, even when the arrangement shown in FIG. 9 is adopted, the same effect can also be achieved as in a situation where the arrangement shown in FIG. 6 is adopted.

(Embodiment 2)

Next, a second embodiment of the present invention will be described with reference to FIG. 10. An image capture device as this second embodiment of the present invention uses an image sensor 10 with a different structure from its counterpart of the first embodiment described above. But other than that, quite the same members are used in both of the first and second embodiments. That is why the following description of this second embodiment will be focused on only the differences from the image capture device of the first embodiment, and their common features will not be described all over again to avoid redundancies.

The image sensor 10 of this embodiment uses a dichroic mirror that disperses incoming light into a light ray representing a primary color and a light ray representing its complementary color instead of a dispersing element that uses diffraction. Also, each dispersing element of this embodiment does not make any light ray incident on a photosensitive cell of an adjacent unit block but makes all light rays incident on only photosensitive cells in its associated unit block. Hereinafter, the basic structure of the image sensor 10 of this embodiment will be described.

FIG. 10 illustrates the basic structure of the image sensor 10 of this embodiment. The image sensor 10 of this embodiment is a backside illumination type. However, it does not matter whether the image sensor 10 of this embodiment is a backside illumination type or a surface illumination type. Therefore, the image sensor 10 may also be a surface illumination type. FIG. 10(a) is a plan view illustrating the surface of the image sensor 10 on the light incident side. In the image sensor 10 of this embodiment, the photosensitive cells are arranged as in the first embodiment described above, and each unit block includes four photosensitive cells 2a through 2d. Four dichroic mirrors 3a, 3b, 3c and 3d are arranged so as to face the photosensitive cells 2a, 2b and 2c, respectively, and define tilt angles with respect to the imaging area. The tilt angles of these dichroic mirrors are defined so that the light reflected from the dichroic mirrors is totally reflected from the interface between this image sensor 10 and the air layer outside of the sensor and then incident on pixels that are adjacent to the pixels that face these dichroic mirrors.

FIGS. 10(b) and 10(c) are cross-sectional views as respectively viewed on the planes C-C' and D-D' shown in FIG. 10(a). As shown in FIGS. 10(b) and 10(c), the image sensor 10 includes: a semiconductor substrate 7 made of silicon or any other suitable material; photosensitive cells 2a through 2d, which are arranged in the semiconductor substrate 7; a transparent layer 6b, which is arranged on the back surface of the semiconductor substrate 7 (i.e., on the light incident side); and dichroic mirrors 3a, 3b, 3c and 3d, which are arranged in the transparent layer 6b. An interconnect layer 5 is arranged on the principal surface of the semiconductor substrate 7 (i.e., opposite to the light incident side). Furthermore, a supporting base 9 is arranged on the principal surface in order to support the semiconductor substrate 7, the interconnect layer 5 and so on. The supporting base 9 is bonded to the semiconductor substrate 7 with the transparent layer 6b interposed between them.

As shown in FIG. 10(b), the dichroic mirror 3a has such a property as to transmit R and G rays and reflect a B ray. On the other hand, the dichroic mirror 3b has such a property as to transmit G and B rays and reflect an R ray. As a result, the R and G rays that have been transmitted through the dichroic mirror 3a are incident on the photosensitive cell 2a. Meanwhile, the B ray that has been reflected from the dichroic mirror 3a is totally reflected from the interface between the transparent layer 6b and the air and then incident on the photosensitive cell 2b. The G and B rays that have been transmitted through the dichroic mirror 3b are incident on the photosensitive cell 2b. Meanwhile, the R ray that has been reflected from the dichroic mirror 3b is totally reflected from the interface between the transparent layer 6b and the air and then incident on the photosensitive cell 2a.

As shown in FIG. 10(c), the dichroic mirror 3c has such a property as to transmit an M ray and reflect a G ray, while the dichroic mirror 3d has such a property as to transmit a G ray and reflect an M ray. As a result, the M ray that has been transmitted through the dichroic mirror 3c is incident on the photosensitive cell 2c. Meanwhile, the G ray that has been reflected from the dichroic mirror 3c is totally reflected from the interface between the transparent layer 6b and the air and then incident on the photosensitive cell 2d. The G ray that has been transmitted through the dichroic mirror 3d is incident on the photosensitive cell 2d. And the M ray that has been reflected from the dichroic mirror 3d is totally reflected from the interface between the transparent layer 6b and the air and then incident on the photosensitive cell 2c.

By using such dichroic mirrors 3a to 3d, each of the photosensitive cells 2a through 2d receives light rays with quite the same color components as in a situation where the arrangement of the first embodiment is adopted. Specifically, the photosensitive cell 2a receives R and G rays that have been transmitted through the dichroic mirror 3a and the R ray that has been reflected from the dichroic mirror 3b. The photosensitive cell 2b receives G and B rays that have been transmitted through the dichroic mirror 3b and the B ray that has been reflected from the dichroic mirror 3a. The photosensitive cell 2c receives an M ray that has been transmitted through the dichroic mirror 3c and an M ray that has been reflected from the dichroic mirror 3d. And the photosensitive cell 2d receives a G ray that has been transmitted through the dichroic mirror 3d and a G ray that has been reflected from the dichroic mirror 3c. As a result, the photoelectrically converted signals S2a through S2d output from the respective photosensitive cells 2a through 2d are also represented by Equations (12) through (15), respectively, as in a situation where the arrangement of the first embodiment described above is adopted. That is why color information can be obtained by performing quite the same processing as what has been described for the first embodiment.

In this manner, the image capture device of this embodiment obtains color image signals by performing signal arithmetic operations on the photoelectrically converted signals S2a through S2d just like its counterpart of the first embodiment described above. Since the image sensor 10 of this embodiment uses no optical elements that absorb light, the loss of light can be cut down significantly compared to a traditional technology that uses color filters or any other light-absorbing optical elements. On top of that, since three color signals can be obtained by performing arithmetic operations on those four photoelectrically converted signals, the image sensor of the present invention can obtain a greater amount of color information from the same number of pixels than an ordinary image sensor does.

As described above, in the image sensor 10 of this embodiment, a dichroic mirror 3a that disperses incoming light into a blue ray and non-blue rays is arranged at the row 1, column 1 position. A dichroic mirror 3b that disperses the incoming light into a red ray and non-red rays is arranged at the row 1, column 2 position. A dichroic mirror 3c that disperses the incoming light into a green ray and non-green rays is arranged at the row 2, column 1 position. And a dichroic mirror 3d that disperses the incoming light into a magenta ray and non-magenta rays is arranged at the row 2, column 2 position. A number of such unit matrices of dispersing elements are arranged to form a repetitive pattern on the imaging area. That is why even if a combination of unit blocks to choose from the photosensitive cell array 200 is changed on a row-by-row or column-by-column basis, the four photoelectrically converted signals to be obtained will always be the same combination of four signals that are represented by Equations (12) through (15), respectively. That is to say, by performing the signal arithmetic operations described above with the target pixel blocks shifted either row by row or column by column, information about the RGB color components can be obtained from almost every single one of those pixels. Consequently, the image capture device of this embodiment not only has higher sensitivity, but also can generate a color image with a higher resolution, than traditional image capture devices.

The basic structure of the image sensor 10 is not limited to the one illustrated in FIG. 10. For example, even if the dichroic mirrors 3a and 3b are changed with each other or even if the dichroic mirrors 3c and 3d are changed with each other, the effect of this embodiment can also be achieved. Furthermore, the arrangements for the first and second rows shown in FIG. 10(a) may be changed with each other. Or the dichroic mirrors 3a and 3b may also be arranged side by side in the column direction, instead of the row direction. Even so, the same effect can also be achieved.

In the embodiment described above, a dichroic mirror is used as the dispersing element. However, a dispersing element according to the present invention may be anything else as long as it can disperse incoming light into a light ray representing a primary color and a light ray representing its complementary color. For example, a micro prism or an optical element that uses diffraction as in the first embodiment described above may also be used as the dispersing element. Furthermore, multiple different kinds of dispersing elements may be used in combination as well.

Industrial Applicability

A solid-state image sensor, image capture device and image processing method according to embodiments of the present invention can be used effectively in every camera that ever uses a solid-state image sensor, and may be used in digital still cameras, digital camcorders and other consumer electronic cameras and in industrial surveillance cameras, to name just a few.

REFERENCE SIGNS LIST 1a, 1b, 1c, 1d, 1e, if dispersing element
2, 2a, 2b, 2c, 2d image sensor's photosensitive cell
3a, 3b, 3c, 3d dispersing element (dichroic mirror)
4a, 4b micro lens
5 image sensor's interconnect layer
6a, 6b transparent layer
7 silicon substrate
9 supporting base
10 image sensor
11 optical filter
12 optical lens
13 signal generating and receiving section
14 sensor driving section
15 image signal generating section
16 image signal output section
17 multilayer filter (dichroic mirror) that reflects every ray but red (R) ray
18 multilayer filter (dichroic mirror) that reflects only green (G) ray
19 multilayer filter (dichroic mirror) that reflects only blue (B) ray
20 opaque portion
21 light-transmitting resin
22 multilayer filter (dichroic mirror) that transmits G ray
23 multilayer filter (dichroic mirror) that transmits R ray
24 organic dye filter that transmits G ray
25 organic dye filter that transmits R ray
26 micro lens
27 metal layer 30 memory
40 unit block of photosensitive cells
100 dispersing element array
200 photosensitive cell array
300 image capturing section
400 signal processing section

The invention claimed is:

1. A solid-state image sensor comprising:
a photosensitive cell array, in which a number of unit blocks are arranged two-dimensionally, each said unit block including first, second, third and fourth photosensitive cells,
a dispersing element array that is arranged so as to face the photosensitive cell array and that includes a plurality of dispersing elements, wherein light that would have been directly incident on each said photosensitive cell if not for the dispersing element array is called that photosensitive cell's entering light, and
the dispersing element array is configured to:
  direct a light ray with a first color component from the first photosensitive cell's entering light such that the light ray with the first color component is not incident on the first photosensitive cell,
  direct a light ray with a second color component from the entering light of the second photosensitive cell to be incident on the first photosensitive cell along with a remainder of the first photosensitive cell's entering light,
  direct a light ray with a second color component from the second photosensitive cell's entering light such that the light ray with the second color component is not incident on the second photosensitive cell,
  direct a light ray with the first color component from the entering light of the first photosensitive cell to be incident on the second photosensitive cell along with a remainder of the second photosensitive cell's entering light,
  direct a light ray with a third color component from the third photosensitive cell's entering light such that the light ray with the third color component is not incident on the third photosensitive cell,
  direct light rays with the first and second color components from the entering light of the fourth photosensitive cell to be incident on the third photosensitive cell along with a remainder of the third photosensitive cell's entering light, and
  direct light rays with the first and second color components from the fourth photosensitive cell's entering light such that the light rays with the first and second color components are not incident on the fourth photosensitive cell,
  direct a light ray with the third color component from the entering light of the third photosensitive cell to be incident on the fourth photosensitive cell along with a remainder of the fourth photosensitive cell's entering light.

2. The solid-state image sensor of claim 1, wherein the dispersing element array includes first, second, third and fourth dispersing elements that are arranged so as to face and be associated with a first, second, third and fourth photosensitive cells, respectively, in each said unit block, wherein:
the first dispersing element directs:
  at least a part of the light ray with the first color component to be incident on the second photosensitive cell, and
  the remainder of the first photosensitive cell's incoming light to be incident on the first photosensitive cell,
the second dispersing element makes directs:
  at least a part of the light ray with the second color component to be incident on the first photosensitive cell, and
  the remainder of the second photosensitive cell's incoming light to be incident on the second photosensitive cell,
the third dispersing element directs:
  at least a part of the light ray with the third color component to be incident on the fourth photosensitive cell, and
  the remainder of the third photosensitive cell's incoming light to be incident on the third photosensitive cell, and
the fourth dispersing element directs:
  at least respective parts of the light rays with the first and second color components to be incident on the third photosensitive cell, and
  a light ray with the third color component from the third photosensitive cell's entering light to be incident on the fourth photosensitive cell.

3. The solid-state image sensor of claim 2, wherein:
the first dispersing element directs a first half and a second half of the light ray with the first color component to be incident on the first dispersing element's associated second photosensitive cell and one of the photosensitive cells of a first adjacent unit block, respectively,
the second dispersing element directs a first half and a second half of the light ray with the second color component to be incident on the second dispersing element's associated first photosensitive cell and one of the photosensitive cells of a second adjacent unit block, respectively,
the third dispersing element directs a first half and a second half of the light ray with the third color component to be incident on the third dispersing element's associated fourth photosensitive cell and one of the photosensitive cells of one of the first and second adjacent unit blocks, respectively, and
the fourth dispersing element directs a first half and a second half of the light rays with the first and second color components to be incident on the fourth dispersing element's associated third photosensitive cell and one of the photosensitive cells of the other of the first and second adjacent unit blocks, respectively.

4. The solid-state image sensor of claim 2, wherein:
the first dispersing element directs almost all of the light ray with the first color component to be incident on the second photosensitive cell,
the second dispersing element directs almost all of the light ray with the second color component to be incident on the first photosensitive cell,
the third dispersing element directs almost all of the light ray with the third color component to be incident on the fourth photosensitive cell, and
the fourth dispersing element directs almost all of the light rays with the first and second color components to be incident on the third photosensitive cell.

5. The solid-state image sensor of claim 1, wherein the first color component is one of colors red and blue, the second color component is the other of the colors red and blue, and the third color component is a color green.

6. The solid-state image sensor of claim 1, wherein each of the first, second, third and fourth dispersing elements:
has a light-transmitting member, and
disperses the incoming light based on the shape of the light-transmitting member and a difference in refractive index between that light-transmitting member and another light-transmitting member that has a lower refractive index.

7. The solid-state image sensor of claim 1, wherein each of the first, second, third and fourth dispersing elements includes a dichroic mirror and disperses the incoming light using the dichroic mirror.

8. An image capture device comprising:
the solid-state image sensor of claim 1;
an optical system that produces an image on the solid-state image sensor; and
a signal processing section that processes signals supplied from the solid-state image sensor and that generates color information by performing arithmetic operations on first, second, third and fourth photoelectrically converted signals that have been supplied from the first, second, third and fourth photosensitive cells, respectively.

9. The image capture device of claim 8, wherein the signal processing section generates first and second color difference signals by performing arithmetic operations, including addition and subtraction, on a first differential signal representing the difference between the first and second photoelectrically converted signals and on a second differential signal representing the difference between the third and fourth photoelectrically converted signals.

10. The image capture device of claim 8, wherein the signal processing section generates a luminance signal by performing an arithmetic operation that involves adding together the first and second photoelectrically converted signals, or the third and fourth photoelectrically converted signals, or the first through fourth photoelectrically converted signals.

11. A method for processing output signals of the solid-state image sensor of claim 1, the method comprising the steps of:
(A) getting first, second, third and fourth photoelectrically converted signals from the first, second, third and fourth photosensitive cells, respectively; and
(B) generating color information based on the first through fourth photoelectrically converted signals.

12. The method of claim 11, wherein the step (B) includes the steps of:
generating a first differential signal representing the difference between the first and second photoelectrically converted signals;
generating a second differential signal representing the difference between the third and fourth photoelectrically converted signals; and
performing an arithmetic operation including addition and subtraction on the first and second differential signals, thereby generating first and second color difference signals.

13. The method of claim 12, wherein the step (B) includes the steps of:
performing an arithmetic operation that involves adding together the first and second photoelectrically converted signals, or the third and fourth photoelectrically converted signals, or the first through fourth photoelectrically converted signals, thereby generating a luminance signal, and
generating colors red, green and blue signals included in the cell's entering light based on the luminance signal and the first and second color difference signals.

* * * * *